United States Patent
Burghartz et al.

[19]

[11] Patent Number: 5,936,299
[45] Date of Patent: Aug. 10, 1999

[54] SUBSTRATE CONTACT FOR INTEGRATED SPIRAL INDUCTORS

[75] Inventors: Joachim Norbert Burghartz, Shrub Oak; Keith Aelwyn Jenkins, Tarrytown; Mehmet Soyuer, Yorktown Heights, all of N.Y.

[73] Assignee: International Business Machines Corporation, Armonk, N.Y.

[21] Appl. No.: 08/815,655

[22] Filed: Mar. 13, 1997

[51] Int. Cl.[6] .......................... H01L 29/00; H01L 29/74; H01L 31/111

[52] U.S. Cl. ...................... 257/531; 257/108; 257/422

[58] Field of Search ........................ 257/108, 422–425, 257/427, 531

[56] References Cited

U.S. PATENT DOCUMENTS

| | | |
|---|---|---|
| 5,416,356 | 5/1995 | Staudinger et al. . |
| 5,446,311 | 8/1995 | Ewen et al. . |
| 5,481,131 | 1/1996 | Staudinger et al. ................. 257/531 |
| 5,497,028 | 3/1996 | Ikeda et al. ....................... 257/531 |
| 5,497,337 | 3/1996 | Ponnapalli et al. . |
| 5,541,442 | 7/1996 | Keil et al. . |
| 5,557,138 | 9/1996 | Ikeda et al. ....................... 257/531 |
| 5,622,886 | 4/1997 | Allum et al. ....................... 438/238 |
| 5,629,553 | 5/1997 | Ikeda et al. ....................... 257/531 |
| 5,635,982 | 6/1997 | Ashby et al. ....................... 336/200 |
| 5,747,870 | 5/1998 | Pedder .............................. 257/531 |

*Primary Examiner*—Mahshid Saadat
*Assistant Examiner*—Allan R. Wilson

[57] ABSTRACT

An inductor structure includes an inductor spiral coil formed on a substrate; and a substrate contact connected to the substrate and disposed within a predetermined distance to the inductor spiral coil to increase the quality-factor (Q) characteristics associated with the inductor structure, and also does not increase eddy currents in the substrate. The substrate contact provides for implementation of the inductor structure as a spiral inductor which is integrated on a silicon substrate. The substrate contact determines the energy potential substantially adjacent to the inductor for reducing the noise level. In an implementation of an inductor in an RF circuit, the substrate contact contributes to providing an increased Q.

15 Claims, 3 Drawing Sheets

SUBSTRATE CONTACT FOR INTEGRATED SPIRAL INDUCTORS

BACKGROUND INFORMATION

1. Technical Field

This disclosure relates generally to spiral inductors fabricated on silicon substrates, and more particularly to a spiral inductor structure with a substrate contact substantially adjacent to the spiral inductor and a predetermined doping distribution under the spiral inductor.

2. Description of the Related Art

Spiral inductors are widely used components of communication systems operating in the frequency range of 1 to 10 GHz and higher. At lower frequencies, inductive characteristics may be achieved with active circuits, while at higher frequencies, distributed LC components, such as microstrips, are utilized. Existing systems operating at radio and microwave frequencies; for example, frequencies greater than 1 GHz, use inductors fabricated on printed circuit boards, on quartz, or on GaAs substrates so that the carrier substrate has nearly ideal dielectric characteristics. Such inductor implementations may not have an electrical contact to the substrate, but instead have a solid groundplane on the backside of the substrate to contain the energy flow.

Recently, implementations of radio frequency (RF) and microwave transceivers on silicon substrates have been utilized to a greater degree due to the low-cost and high-volume manufacturing capabilities of silicon technology. Silicon is a relatively good substrate for RF and microwave applications, except for its low resistivity which causes high RF losses.

In the prior art, as shown in FIG. 1, a spiral inductor on a silicon substrate may be represented by a lumped-element model, in which the spiral coil 10 of the spiral inductor is modeled by an ideal inductance 12 labeled $L_S$; a series resistance 14, which may vary as a function of frequency f, that is, the series resistance 14 is $R_S(f)$; and an inter-wire capacitance 16 labeled $C_P$ between two ports 18, 20. The coupling of the spiral coil 10 to the substrate is represented by the oxide capacitances 22, 24 labeled $C_{OX}$ and the resistances 26, 28 labeled $R_B$. A resistance 30 labeled $R_{SUB}$ is provided between the low-doped region under the spiral coil 10 and the substrate contact 32, which may be laterally spaced from the spiral coil 10. Two generic implementations of such an inductor in a circuit are known in the prior art: one-port implementations with one port of the spiral inductor connected to ground, and two-port implementations with both ports terminated at high impedance.

Further, two implementations of a substrate contact are known in the prior art; that is, the substrate contact may be substantially adjacent to the inductor so that the resistance $R_{SUB}$ is minimized, or the substrate contact may be omitted so that $R_{SUB}$ is treated as being infinite.

In the prior art, for example, in U.S. Pat. No. 5,481,131, which is incorporated herein by reference, spiral coils are known which are enclosed by metal rings without contacting such metal rings. Such metal rings may be a second plate of a capacitor and are not connected to the substrate.

In addition to the use of substrate contacts in the suppression of noise levels, substrate contacts provide improved operating characteristics in two-port implementations in which the ports 18, 20 of the inductor are terminated at high impedances. The inductance and Q may then be derived from the scattering parameter S21, which is the ratio of transmitted power at the output port to the injected power at the input port in two-port implementations.

Without a substrate contact, when the inductor is operated near the maximum Q, an input RF signal passes with a substantially identical magnitude through both the inductive path having the inductor $L_S$ 12 and the capacitive path having the capacitances 22, 24 labeled $C_{OX}$; that is, the signal across the capacitor $C_P$ 16 is typically negligible for operation near the maximum Q. With an ideal substrate contact, signal transfer via the capacitors 22, 24 labeled $C_{OX}$ to the output port is suppressed so that the maximum Q is limited mainly by $R_S$, which represents ohmic losses in the spiral coil 10 and, to a minor degree, is limited by substrate losses.

Typically, there are two known methods for incorporating an inductor in a circuit: the ground potential is either common with one of the inductors ports or has a certain impedance between the inductor ports and the ground. Using a silicon substrate connected to ground, due to the intermediate resistivity of the silicon substrate, the associated ground potential is not well-defined equally across the length of the entire silicon substrate. Such uneven ground potential is due to the characteristics of bulk silicon in that bulk silicon is too low-resistive to be treated as a quasi-dielectric yet too high-resistive to be considered as a groundplane.

Additional doping of the silicon substrate may reduce the resistivity of the silicon substrate, but a high doping level under a spiral inductor causes relatively large eddy currents in the silicon substrate. As described in U.S. Pat. No. 5,446,311 and in pending U.S. patent application Ser. No. 08/594,455, now U.S. Pat. No. 5,656,849 issued Aug. 12, 1997 entitled "Two-Level Spiral Inductor Structure Having a High Inductance/Area Ratio", which are incorporated herein by reference, the occurrence of such relatively large eddy currents reduces the quality-factor (Q) of the inductor. For an inductor with a high Q, any doping is therefore generally blocked out from under the spiral coil.

Heretofore, such implementations of spiral inductors with high Q without contact to the substrate have encountered relatively poor operating characteristics due to such large eddy currents.

SUMMARY

It is recognized herein that the use of a substrate contact, positioned to be laterally spaced from the inductor to be substantially close thereto, may be used to provide a distributed resistance to the region under the spiral coil for improved Q operation.

An inductor structure is disclosed which includes an inductor spiral formed on a substrate; and a substrate contact connected to the substrate and disposed within a predetermined distance to the inductor spiral to increase the quality-factor (Q) characteristics associated with the inductor structure. Such proximity also does not increase eddy currents in the substrate.

The substrate contact provides for implementation of the inductor structure as a spiral inductor which is integrated on a silicon substrate. The substrate contact determines the energy potential substantially adjacent to the inductor for reducing the noise level. In an implementation of an inductor in an RF circuit, the substrate contact contributes to providing an increased Q.

BRIEF DESCRIPTION OF THE DRAWINGS

The features of the disclosed spiral inductor structure will become more readily apparent and may be better understood by referring to the following detailed description of illustrative embodiments of the present invention, taken in conjunction with the accompanying drawings, in which.

DESCRIPTION OF THE PREFERRED EMBODIMENTS

Figure 1:
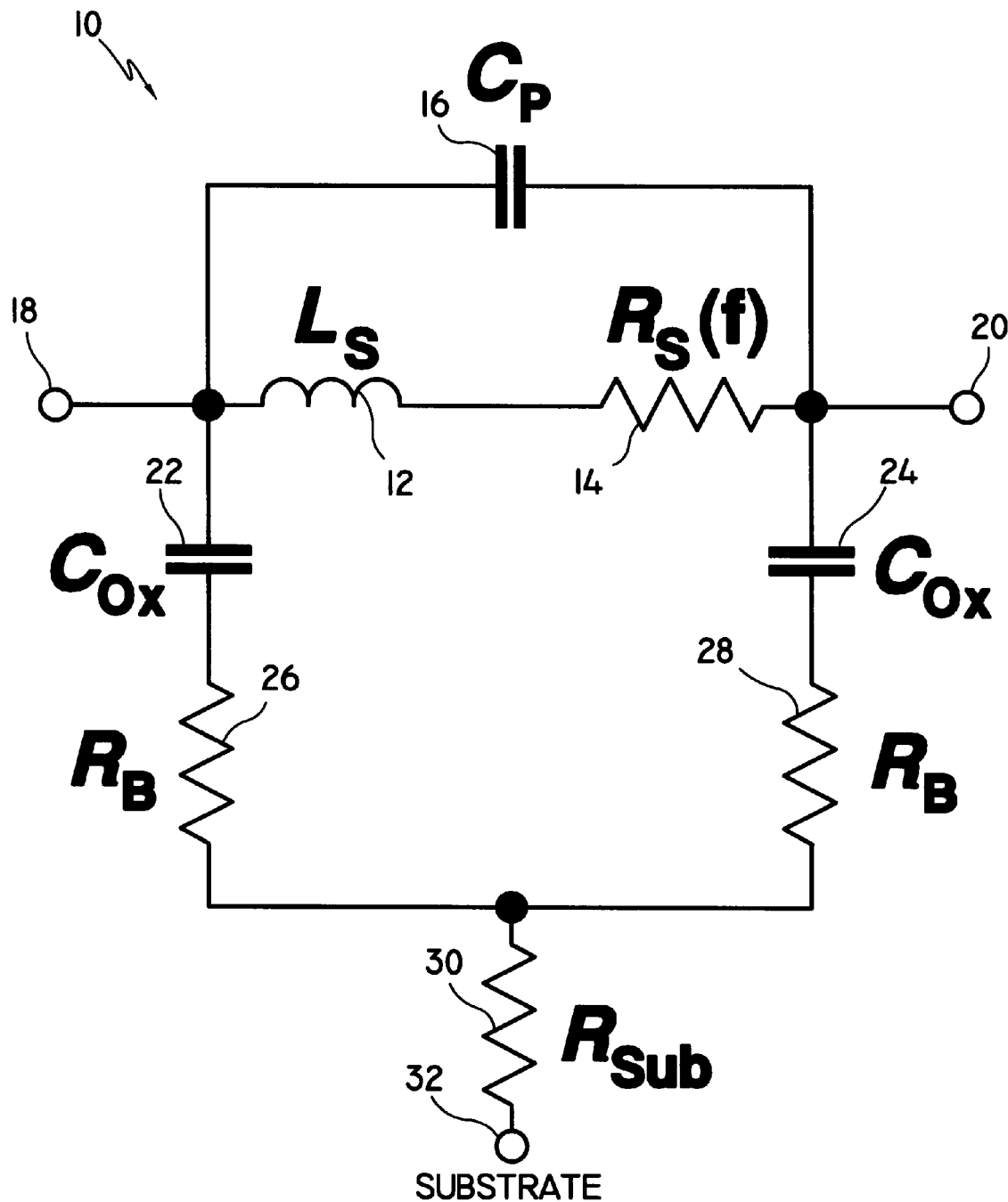
FIG. 1 is a schematic drawing of an inductor structure represented by a lumped-element model in the prior art.
Figure 2:
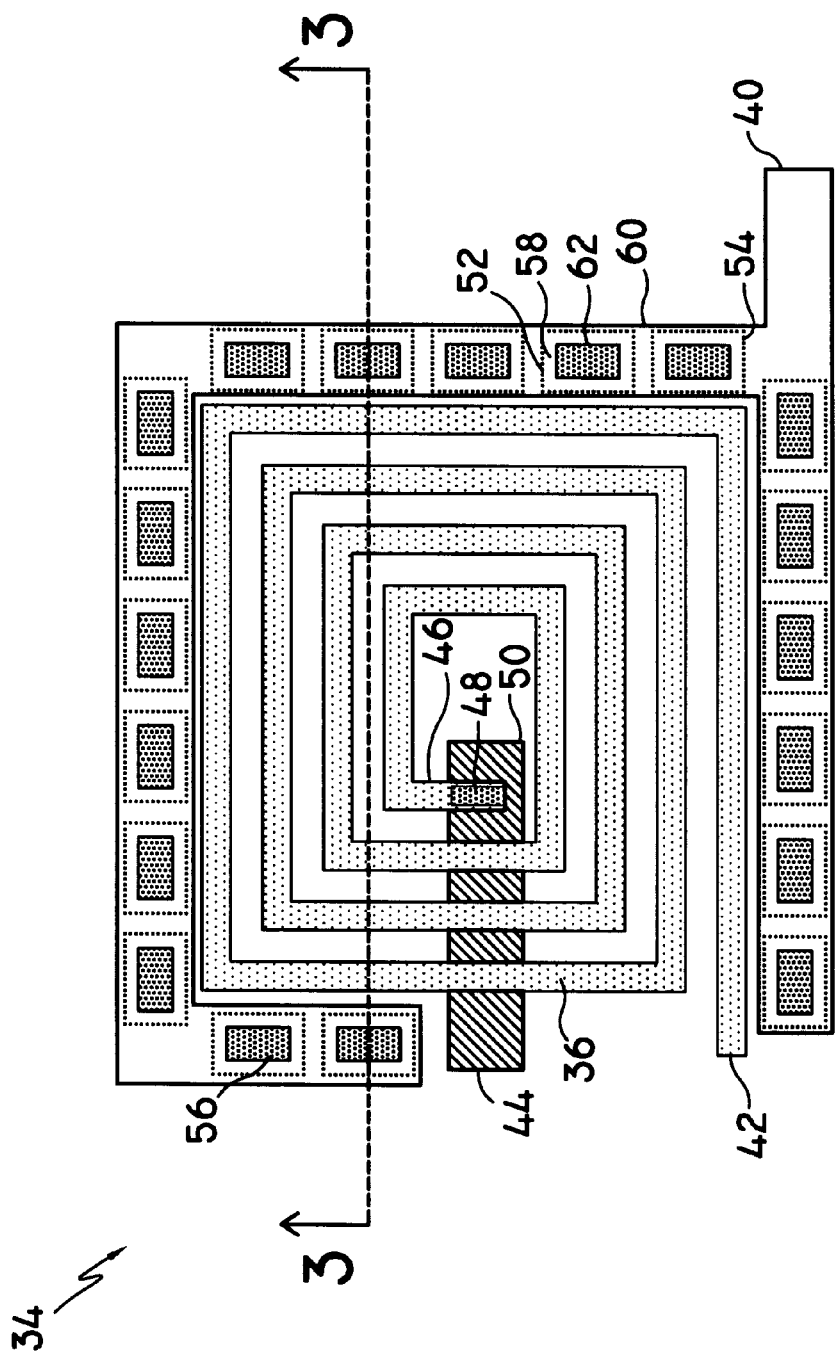
FIG. 2 is a plan view of the disclosed inductor structure.

Referring now in specific detail to the drawings, with like reference numerals identifying similar or identical elements, as shown in FIG. 2, the disclosed spiral inductor structure 34 includes the spiral coil structure 36 which confines the current flow in the substrate 38 to the region close to the wafer surface. The spiral coil structure 36 is enclosed at least partially by a substrate contact 40 and is spaced within a predetermined distance from the substrate contact 40. For example, the predetermined distance may be about 10 μm.

Such an inductor structure 34 with the predetermined spacing between the spiral coils structure 36 and the substrate contact 40 causes the associated model resistance $R_{SUB}$ to becomes relatively small and the associated model resistance $R_B$ to become relatively large. Under such circumstances, the power through the inductor structure 34 is mainly transmitted across the path of the model inductance $L_S$ so that Q is maximum with respect to the ohmic losses of the spiral coil structure 36, represented by the model resistance $R_S$.

In contrast to spiral coil structures in the prior art, the substrate 38 is connected to the substrate contact 40, which may be a metal contact.

As shown in FIG. 2, in an illustrative embodiment, the spiral coil structure 36 has two ports 42, 44, in which the port 44 may be implemented as an underpass at a lower metal level. An inner portion 46 of the spiral coil structure 36 is brought out through a via contact 48 and is connected to a portion 50 of the port 44.

In the illustrative embodiment shown in FIG. 2, the substrate contact 40 at least partially enclosing the spiral coil structure 36 may be formed to include a series of substantially rectangular substrate contacts 52–56 such that the spiral inductor structure 34 and the spiral coil structure 36 thereof are at least partially enclosed by the series of rectangular substrate contacts 52–56. Referring to FIG. 2 in conjunction with FIGS. 3–4 for an exemplary rectangular substrate contact 52, each rectangular substrate contact 52 includes a diffused region 58 in electrical contact with a metal pad 60 by a metal via 62.

Figure 3:
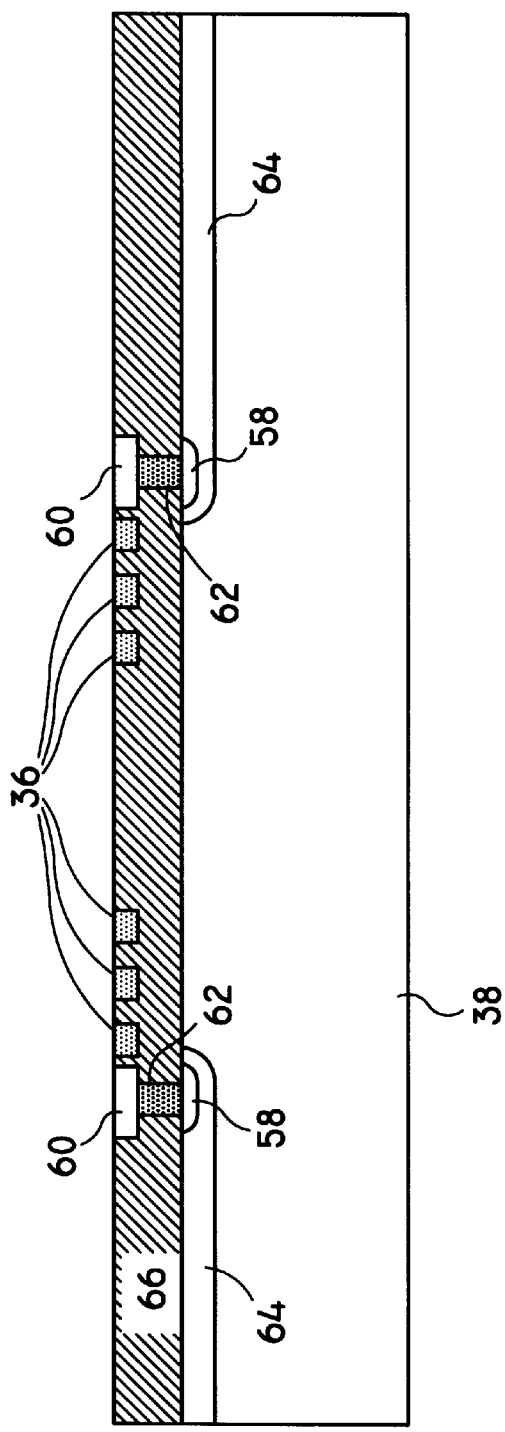
FIG. 3 is a cross section view of the disclosed inductor structure taken across lines 3—3 in FIG. 2.

In a first illustrative embodiment shown in FIG. 3, which is a cross-section view of the spiral inductor structure 34 along lines 3—3 of FIG. 2, the diffused region 58 has the same type of doping as a channel stop region 64 which covers the field regions under the field oxide isolation layer 66, but the channel stop region 64 is blocked out from underneath the spiral coil structure 36. The types of doping of region 64 and the substrate 38 are identical. The doping level of the channel stop region 64 is typically between the doping level of the substrate 38 and the doping level of the diffused region 58.

One skilled in the art of integrated devices on silicon substrates will understand that the spiral inductor structure 34 may also be fabricated without the channel stop region 64 without losing its advantages. Alternatively, for implementations with channel stop regions having a different type of doping than the diffused region 58, the spiral inductor structure 34 may be fabricated as shown in FIG. 4, which illustrates an alternative cross-section view of the spiral inductor structure 34 along lines 3—3 in FIG. 2.

Figure 4:
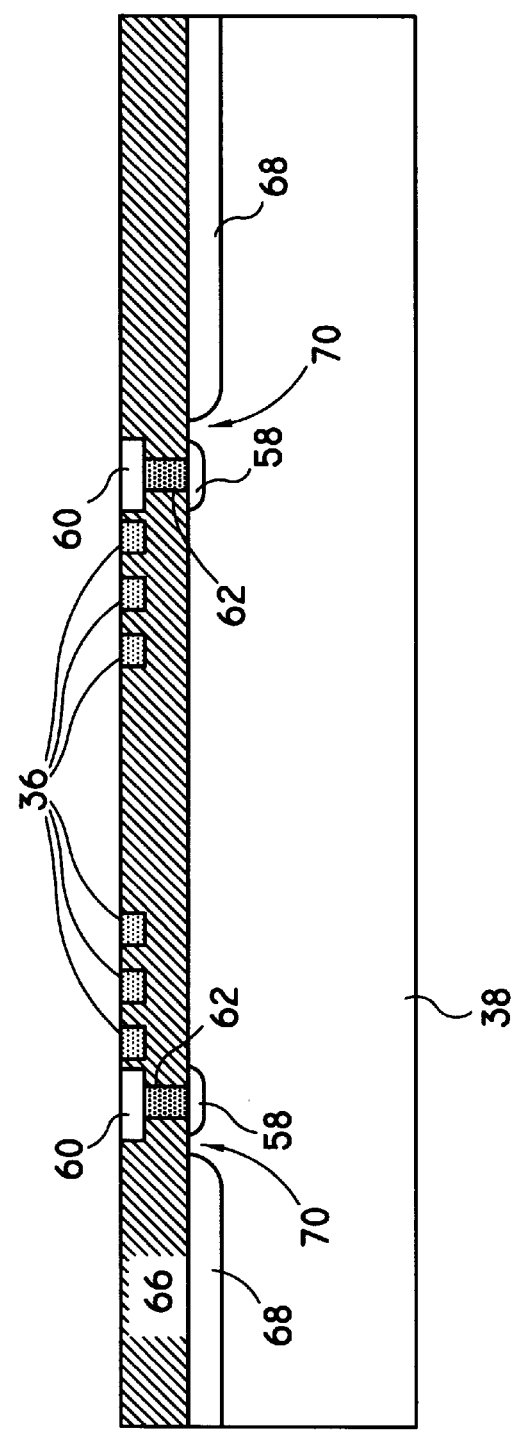
FIG. 4 is a cross section view of an alternative embodiment of the disclosed inductor structure taken across lines 3—3 in FIG. 2.

In the alterative embodiment shown in FIG. 4, the diffused region 58 is in direct contact with the substrate 38, and the channel stop region 68 in FIG. 4 is doped opposite to the doping of the diffused region 58 and of the substrate 38. The channel stop region 68 is fabricated such that there is at least a minimum spacing 70 between the diffused region 58 and the channel stop region 68 having an opposite doping.

The spiral inductor structure 34 shown in FIG. 2 may be configured in one-port implementations and two-port implementations. For one-port implementations, one of the ports 42, 44 is grounded, with the position of the substrate contact 40 being relatively close to the spiral coil structure 36 facilitating improved control of the operating characteristics of the spiral inductor structure 34.

For two-port implementations, the configuration of the spiral inductor structure 34 with contact the substrate 38 through the substrate contact 40 provides for high Q performance without increasing eddy currents, which provides improved operating characteristics of the spiral inductor structure 34.

While the disclosed spiral inductor structure has been particularly shown and described with reference to the preferred embodiments, it is understood by those skilled in the art that various modifications in form and detail may be made therein without departing from the scope and spirit of the invention. Accordingly, modifications such as those suggested above, but not limited thereto, are to be considered within the scope of the invention.

What is claimed is:

1. An inductor structure comprising:
   an inductor spiral formed on a semiconductor substrate occupying an inductor spiral region; and
   a substrate contact connected to the substrate and disposed within a predetermined distance to the inductor spiral at least partially enclosing the inductor spiral region to increase quality-factor Q characteristics associated with the inductor structure, the quality-factor Q being increased to greater than five.

2. The inductor structure of claim 1, wherein the inductor spiral is disposed upon an isolation layer between the inductor spiral and the substrate.

3. The inductor structure of claim 1, wherein the substrate contact includes:
   a diffused region having a doping substantially identical to the doping of a channel stop region connected to the diffused region.

4. The inductor structure of claim 1, wherein the substrate contact includes:
   a diffused region having a doping opposite to the doping of a channel stop region, wherein the diffused region is separated from the channel stop region by a predetermined spacing.

5. The inductor structure of claim 1, wherein the inductor spiral includes at least one port connected to ground for operation of the inductor structure in a one-port configuration.

6. The inductor structure of claim 1, wherein the inductor spiral includes at least two ports, with each port respectively connected to elements having impedances for operation of the inductor structure in a two-port configuration.

7. The inductor structure of claim 1, wherein the inductor spiral receives signals having frequencies of at least 1 GHz.

8. A spiral inductor structure comprising:

a semiconductor substrate;

an inductor spiral formed on the substrate occupying an inductor spiral region; and a plurality of substrate contacts formed on the substrate and at least partially enclosing the inductor spiral region, wherein the plurality of substrate contacts are disposed within a predetermined distance to the inductor spiral to increase quality-factor Q characteristics associated with the inductor structure, the quality-factor Q being increased to greater than five.

9. The inductor structure of claim 8, further comprising:

an isolation layer; and wherein the inductor spiral is disposed upon the isolation layer between the inductor spiral and the substrate.

10. The inductor structure of claim 8, further comprising:

a channel stop region connected to the substrate; and wherein each of the plurality of substrate contacts includes:

a diffused region having a doping substantially identical to the doping of the channel stop region connected to the diffused region.

11. The inductor structure of claim 8, further comprising:

a channel stop region connected to the substrate; and wherein each of the plurality of substrate contacts includes:

a diffused region having a doping opposite to the doping of the channel stop region, wherein the diffused region is separated from the channel stop region by a predetermined spacing.

12. The inductor structure of claim 8, wherein the inductor spiral includes at least one port connected to ground for operation of the inductor structure in a one-port configuration.

13. The inductor structure of claim 8, wherein the inductor spiral includes at least two ports, with each port respectively connected to elements having impedances for operation of the inductor structure in a two-port configuration.

14. The inductor structure of claim 8, wherein the inductor spiral receives signals having frequencies of at least 1 GHz.

15. The inductor structure of claim 8, wherein the substrate includes silicon.

* * * * *